United States Patent

Bickham et al.

[11] Patent Number: 6,018,514
[45] Date of Patent: Jan. 25, 2000

[54] APPARATUS AND METHOD FOR PROTECTING A COMMUNICATION DEVICE OPERATING IN AN UNDESIRABLE ENVIRONMENT

[75] Inventors: Richard S. Bickham, Cary; Allen L. Davidson, Crystal Lake, both of Ill.

[73] Assignee: Motorola, Inc., Schaumburg, Ill.

[21] Appl. No.: 09/106,401

[22] Filed: Jun. 29, 1998

[51] Int. Cl.[7] .................................................. H04L 1/00
[52] U.S. Cl. ............................................. 370/217; 370/225
[58] Field of Search ..................................... 370/217, 225, 370/226, 252; 455/67.1, 67.3

[56] References Cited

U.S. PATENT DOCUMENTS 4,202,025  5/1980  Le Cardonnel ........................ 370/217

*Primary Examiner*—Melvin Marcelo
*Attorney, Agent, or Firm*—Daniel C. Crilly; Steven A. May

[57] ABSTRACT

A desirable operating condition is maintained in a communication device (100) that is operating in an undesirable environment by reducing the number of radio frequency signals being amplified and subsequently transmitted by the communication device (100). The remaining radio frequency signals transmitted will be transmitted at full power, so that coverage area is maintained in a tradeoff for reduced capacity.

19 Claims, 4 Drawing Sheets

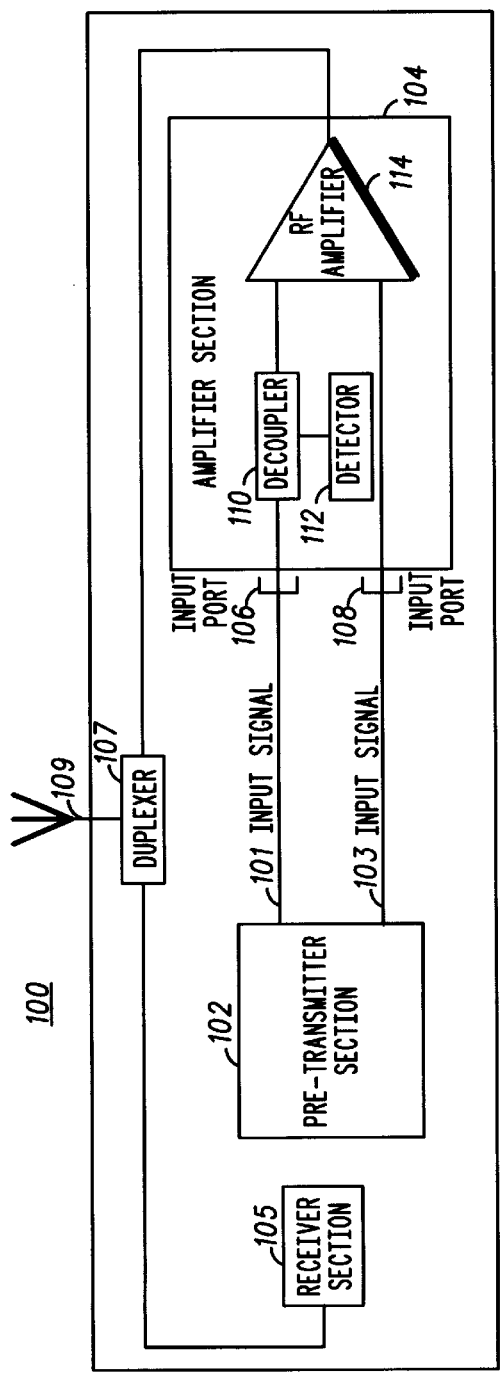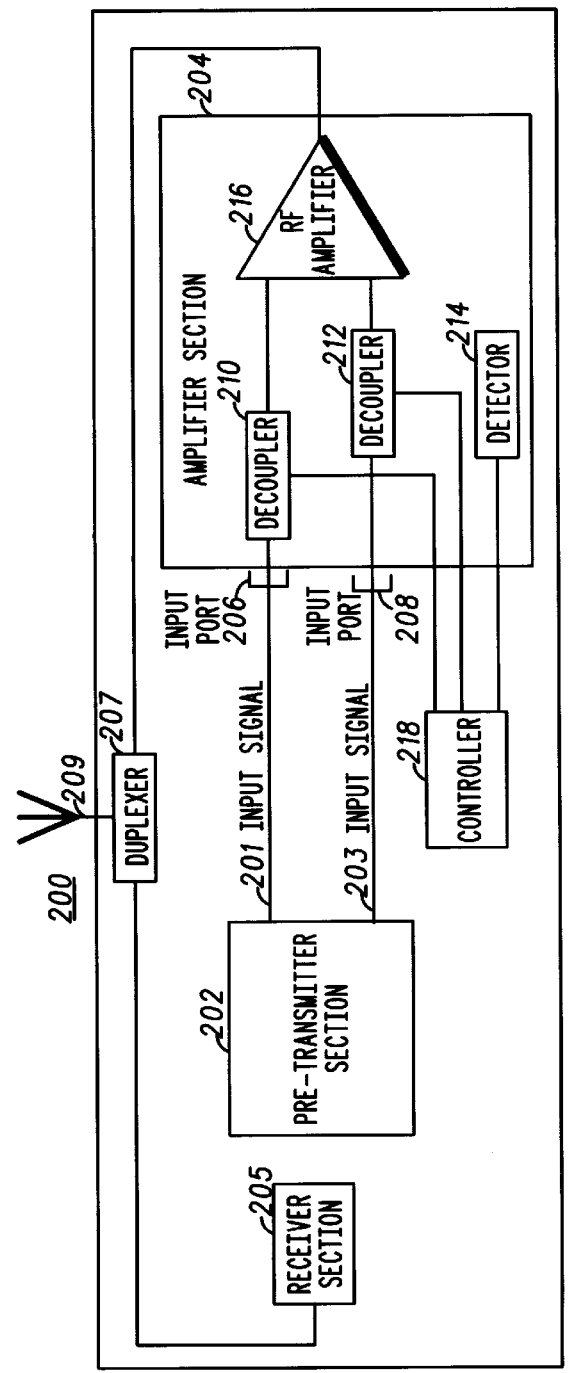

APPARATUS AND METHOD FOR PROTECTING A COMMUNICATION DEVICE OPERATING IN AN UNDESIRABLE ENVIRONMENT

FIELD OF THE INVENTION

The present invention relates generally to communication devices, and in particular to protecting communication devices from undesirable operating conditions.

BACKGROUND OF THE INVENTION

Companies in the wireless communications market compete on, among other things, price, sound quality, and geographical area coverage. Coverage includes both the geographical area over which communication service is provided and the company's ability to seamlessly provide communication service within that area, with smooth hand-offs and without dropped calls or significant signal degradation.

The radio infrastructure that provides communication service in a radio communication system includes base sites positioned at various locations throughout the system. Each base site provides communication service to a respective coverage area and each comprises one or more base stations, along with other items of equipment. Each base station comprises one or more receivers and one or more high power transmitters that can receive a low power radio frequency (RF) signal from a mobile or portable communication unit and rebroadcast the RF signal to other communication units, receive an RF signal, demodulate it, and route it to a telephone interconnect device or other wireline destination, or accept a communication from a telephone interconnect or other wireline destination and then broadcast the communication as a modulated RF signal to a mobile or portable communication unit.

Base sites in radio communication systems are preferably positioned throughout the system to maintain a desired level of received signal quality (one measure of which is carrier-to-interference plus noise ratio as perceived by the base stations and the mobile/portable communication units). Yet the economics of these systems dictate that the base sites must be so located as to minimize the investment in both infrastructure equipment and system installation.

The spacing of the base sites and their non-uniform broadcast patterns create the potential for "holes" in coverage. Holes are areas where the quality of the RF signal transmitted between the mobile or portable communication unit and the base site degrades to the point of being unacceptable. One way of eliminating holes in coverage is to locate in the holes base sites that are small in size and low in equipment and installation cost ("mini-base site"). The mini-base sites comprise one or more low cost base stations that are physically smaller in size and lower in power than the base stations at regular base sites, and are capable of transmitting signals over several RF channels at a specified output power level per channel. Mini-base site base stations are capable of outdoor installation, which minimizes their installation costs and maximizes their flexibility in location but which also subjects them to direct sunlight and high temperatures in uncontrolled environments.

Known methods of maintaining a desirable operating temperature for a base station transmitter in a high temperature environment include fans and decreasing RF output power (RF power shutback). For the base stations at mini-base sites, fans are disadvantageous due to their additional cost and to the desire to keep these base stations as inconspicuous as possible (fans being a source of acoustic noise). However, even with fans, there is often a need for additional thermal management. Such additional thermal management is normally provided by the shutback (reduction) of the power of the transmitted RF signal by reducing its level of amplification when the transmitter is operating in high temperature conditions. Reducing the level of amplification in turn reduces the amount of power being dissipated in the transmitters and helps maintain a safe, reliable operating temperature inside the transmitter.

However, with respect to a system of mini-base sites, reduction of the power of the transmitted signal would mean reduced area coverage at high temperature, which would reintroduce coverage holes into the system. To assure complete coverage in a high temperature environment, more mini-base sites per unit of coverage area would be needed or larger, higher power transmitters would have to be used. The use of more mini-base sites or larger, higher power transmitters would mean higher equipment, installation, and operating costs, which runs contrary to the idea of a small, easy-to-install, low cost system to fill in the holes.

Therefore, a need exists for an apparatus and method of RF amplifier protection that maintains a desirable operating temperature in a transmitter that is operating in a high temperature environment, while not requiring excess coverage at normal temperatures or reduced coverage at high temperatures.

BRIEF DESCRIPTION OF THE DRAWINGS

FIG. 1 is a block diagram illustration of the communication device in accordance with a preferred embodiment of the present invention.

FIG. 2 is a block diagram illustration of the communication device in accordance with an alternative embodiment of the present invention.

DESCRIPTION OF THE PREFERRED EMBODIMENT

Figure 3:
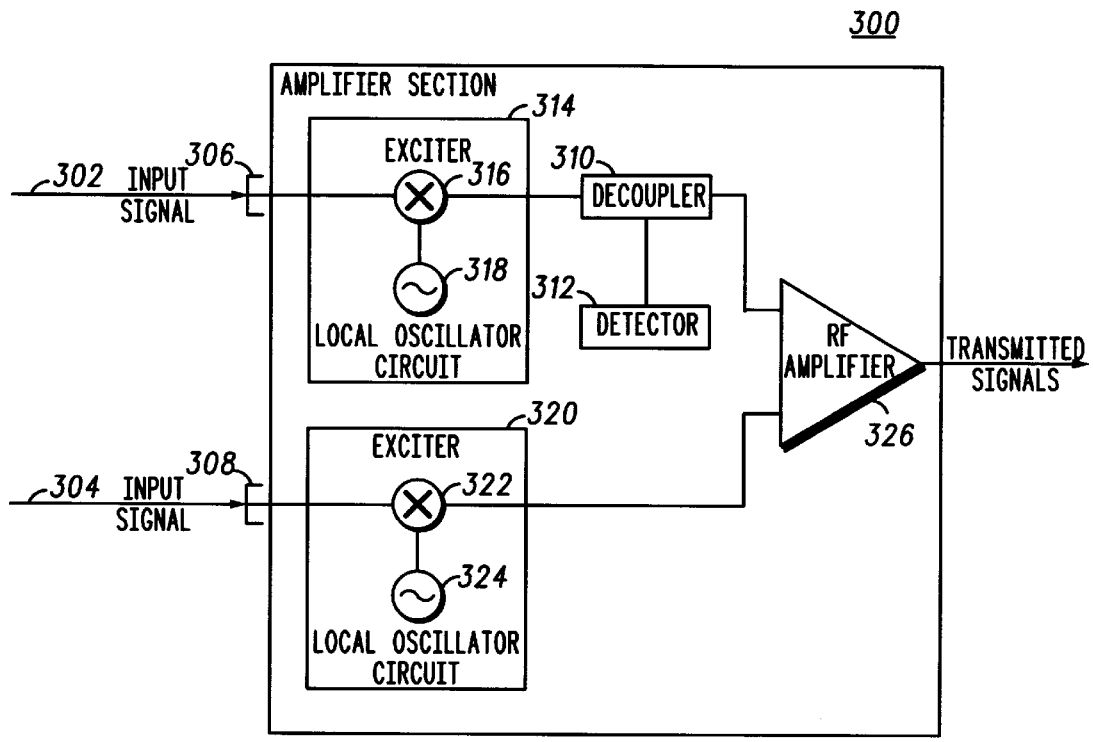
FIG. 3 is a block diagram illustration of an amplifier for use in a communication device in accordance an alternative embodiment of the present invention.

Generally, the present invention encompasses a method and apparatus for maintaining a desirable operating condition of a high power radio frequency (RF) transmitter operating in an undesirable environment, without sacrificing system coverage. An undesirable environment, such as a high ambient temperature, can create an undesirable operating condition (e.g., an excessively high internal temperature), in a high power, RF transmitter. The apparatus maintains a desirable operating condition in the undesirable environment by reducing the number of RF signals being amplified and subsequently transmitted by the RF transmitter, while maintaining the output power level of the remaining signals that continue to be transmitted. By amplifying fewer signals, the amount of power dissipated within the RF transmitter is reduced and the undesirable operating condition of the transmitter is eliminated. The capacity (the number of independent communication traffic channels which can be transmitted) of the mini-base site containing the RF transmitter is also reduced by this method. However, the channels that continue to be transmitted will be transmitted at full power; thus there will be no reduction in coverage area of the transmitted channels. The tradeoff of lower capacity for constant coverage area in an undesirable environment is considered by system providers to be superior to the opposite tradeoff of constant capacity for reduced coverage area provided by known methods such as RF power shutback.

The present invention can be more fully understood with reference to FIGS. 1–6. FIG. 1 illustrates a communication device 100 in accordance with a preferred embodiment of the present invention. The communication device 100 preferably comprises an antenna 109, a duplexer 107, a receiver section 105, a pre-transmitter section 102, and an amplifier section 104. Alternatively, instead of the duplexer 107, the communication device 100 could comprise at least two antennas, one antenna being coupled to the amplifier section 104 and another antenna being coupled to the receiver section 105. The amplifier section 104 comprises at least two input ports 106, 108 (two shown), a detector 112, at least one decoupler 110 (one shown), and an RF amplifier 114.

The pre-transmitter section 102 provides multiple input signals 101, 103 (two shown) to the amplifier section 104. Each of the input signals 101, 103, may comprise one or more independent communication traffic channels. The input signals 101, 103 are coupled to the input ports, 106, 108 respectively, and are then routed to the RF amplifier 114. The RF amplifier 114 amplifies each of the input signals 101, 103 to a desired output power level for subsequent transmission.

The detector 112 preferably comprises a voltage divider circuit that includes at least two resistive components, one of which could be a thermistor. Alternatively, the detector 112 could comprise a low impedance (e.g., 0.02 ohms) series resistor in a DC feed to a power transistor. The detector 112 provides an undesirable operating condition signal (e.g., a voltage) to the decoupler 110 indicating that the detector 112 has either detected an undesirable operating condition (e.g., an excessively high temperature, or, alternatively, an excessively high DC current drain) or has failed to detect a desirable operating condition (e.g., a normal operating temperature or, alternatively, a normal DC current drain) inside the communication device 100.

In the event that the undesirable operating condition signal indicates that the detector 112 has detected an undesirable operating condition, the decoupler 110 (e.g., a voltage controlled switch) decouples at least one, but less than all, of the at least two input signals 101, 103 from the amplifier section 104, so that the decoupled input signal (e.g. input signal 101) never reaches the RF amplifier 114. The decoupled input signal 101 is neither amplified nor transmitted by the amplifier section 104, while the remaining input signal 103 is amplified to full power and transmitted. The reduction in the number of input signals being amplified reduces the amount of power being dissipated in the amplifier section 104 and/or the amount of DC current being drawn by the power transistors, thereby eliminating the excessively high temperature or current drain conditions. Numerous techniques for detecting an undesirable operating condition and for coupling and decoupling one or more input signals based upon the detection of such undesirable operating condition may occur to those of ordinary skill in the art without departing from the spirit and scope of the present invention as defined by the appended claims.

FIG. 2 illustrates an alternate embodiment of the communication device 200. As shown in FIG. 2, the communication device 200 comprises an antenna 209, a duplexer 207, a receiver section 205, a pre-transmitter section 202, a controller 218, and an amplifier section 204. The amplifier section 204 comprises multiple input ports 206, 208, a detector 214, multiple decouplers 210, 212, and an RF amplifier 216. The controller 218 is coupled to the at least two decouplers 210, 212 and the detector 214, and comprises a microprocessor, or alternatively a digital signal processor, or both.

As in the preferred embodiment, the pre-transmitter section 202 provides at least two input signals 201, 203 to the amplifier section 204. Each of the input signals 201, 203 may comprise one or more independent communication traffic channels. The input signals 201, 203 are coupled to the input ports 206, 208, respectively, and are routed to the RF amplifier 216. The RF amplifier 216 amplifies each input signal 201, 203 to a designated output power level and each amplified input signal is then transmitted. The detector 214 provides an undesirable operating condition signal (e.g., a voltage) to the controller 218 to indicate that it has either detected or failed to detect an undesirable operating condition.

The controller 218 monitors the channel utilization of the input signals 201, 203. In the event that the undesirable operating condition signal indicates that the detector 214 has detected an undesirable operating condition, the controller 218 determines, based on the channel utilization of the input signals 201, 203, which signal(s) to decouple and sends a control signal (e.g., a voltage) to the appropriate decoupler (s) 210, 212. For example, in time division multiple access (TDMA) systems, some signals occupy two time slots in a single time frame while other signals occupy only one time slot per frame. In such systems, the controller 218 preferably monitors the time slot occupancy and decouples signals occupying two time slots per frame first, thereby obtaining the same amount of power reduction and less capacity reduction than would be obtained by decoupling two signals occupying one time slot per time frame each. Alternatively, the controller could monitor the quality of each channel, as measured by a quality metric such as carrier-to-noise plus interference, and decouple the signals transmitted in the poorest quality channels.

In response to the control signal(s), the decoupler(s) 210, 212 decouple at least one, but less than all, of the input signals 201 and 203 from the amplifier section 204, such that each decoupled input signal never reaches the RF amplifier 216. Each decoupled input signal is neither amplified nor transmitted by the amplifier section 204, while the remaining input signal or signals are amplified to full power for subsequent transmission.

Similar to the preferred communication device 100 of FIG. 1, the alternate communication device 200 shown in FIG. 2 maintains a desirable operating condition of a high power, RF transmitter operating in an undesirable environment while not sacrificing system coverage. Input signals are selectively decoupled and prevented from being amplified and transmitted while the output power levels of the remaining input signals are unaltered.

FIG. 3 illustrates an alternate embodiment of the amplifier section 300 used in the communication device 100 of FIG.

1. In FIG. 3, the amplifier section 300 comprises multiple input ports 306, 308 (two shown), multiple exciters 314, 320 (two shown), at least one decoupler 310 (one shown), a detector 312 coupled to the decoupler 310, and an RF amplifier 326. Each exciter 314, 320 is shown comprising a mixer 316, 322, and a local oscillator circuit 318, 324, respectively.

In this embodiment, at least two input signals 302, 304 carry the information that is desired to be transmitted. Each input signal 302, 304 is routed to a respective exciter 314, 320. Each exciter 314, 320 mixes its respective input signal 302, 304 with an RF carrier signal generated by its respective local oscillator circuit 318, 324. The output of each exciter 314, 320 is a modulated RF signal that is routed to the RF amplifier 326. The RF amplifier 326 amplifies each modulated RF signal to a desired output power level for subsequent transmission.

Similar to the discussion with respect to FIG. 1, the detector 312 will provide an undesirable operating condition signal to the decoupler 310 indicating whether the detector 312 has either detected or failed to detect an undesirable operating condition inside the communication device. In the event that an undesirable operating condition signal indicates that the detector 312 has detected an undesirable operating condition, the decoupler 310, which is coupled between exciter 314 and the RF amplifier 326, decouples the output signal of mixer 316 from the RF amplifier 326, thereby preventing amplification of the mixer's output signal. Input signal 304 is still mixed with the RF signal generated by local oscillator circuit 324, and the resulting output signal from mixer 322 is amplified to full power for subsequent transmission.

In an embodiment of the amplifier section 300, the decoupler 310 may be coupled between the local oscillator circuit 318 and the mixer 316 in exciter 314. In the event that an undesirable operating condition signal indicates that the detector 312 has detected an undesirable operating condition, the decoupler 310 decouples the RF carrier signal generated by the local oscillator circuit 318 from the mixer 316. As a result, input signal 302 is not mixed with the RF carrier signal and there is no resultant mixer output signal to be amplified by the RF amplifier 326.

In an alternate embodiment of the detector 112 used in the communication device 100, the detector 112 might include a heat sensor. By way of example, the heat sensor could be a thermistor, which is a component having a resistance that varies with temperature. One way of sensing temperature is to include the thermistor in a voltage divider circuit, with the result being a stepped-down voltage as a function of the temperature of the thermistor. The stepped-down voltage could then be used as the undesirable operating condition signal.

As briefly discussed above, the present invention provides a technique for maintaining a desirable operating condition of a high power, RF transmitter in an undesirable environment without sacrificing system coverage. Upon detection of an undesirable operating condition, such as excessive heat, in some part of the communication device, a decoupler decouples at least one input signal from the transmitter. The decoupled input signal is prevented from being amplified and subsequently transmitted by the mini-base site base station, while the output power levels of the remaining input signals are maintained and they will continue to be transmitted. By amplifying fewer signals, the amount of power being consumed by the base station's transmitter and dissipated within the transmitter is reduced and the undesirable operating condition of the transmitter is eliminated.

Figure 4:
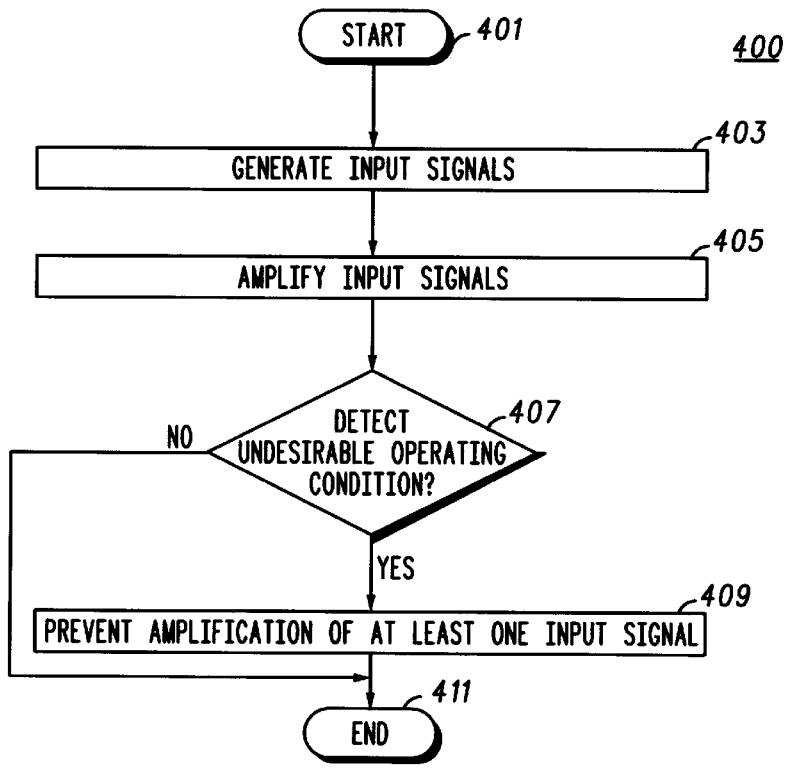
FIG. 4 is a logic flow diagram of steps executed to provide protection of a multi-channel communication device in accordance with a preferred embodiment of the present invention.

FIG. 4 illustrates a logic flow diagram 400 of steps executed by a multi-channel communication device in order to protect the communication device from operating in an undesirable operating condition in accordance with a preferred embodiment of the present invention. The logic flow begins (401) with the generation of at least two input signals in the communication device (403). The input signals are routed to an amplifier section of the communication device where they are amplified by at least one RF amplifier to produce amplified signals having a desired power level (405) for subsequent transmission. A detector either detects or fails to detect an undesirable operating condition in the communication device (407), and provides an undesirable operating condition signal indicating that it has either detected or failed to detect an undesirable operating condition.

In the event that the undesirable operating condition signal indicates that the detector has detected an undesirable operating condition, the amplification of at least one of the input signals ceases or in some way is prevented in order to eliminate the undesirable operating condition (409), while the power level of at least one of the amplified signals is prevented from being diminished in order to avoid reduction in geographic area coverage, and the logic flow ends (411). However, if the undesirable operating condition signal indicates that the detector has failed to detect an undesirable operating condition (407), there will be no cessation in or prevention of the amplification of the input signals.

In the preferred embodiment of the present invention as illustrated in FIG. 4, the step of detecting an undesirable operating condition (407) includes the detection of the operating temperature of at least one RF amplifier. The detection of an undesirable operating condition then comprises the detection of an excessively high operating temperature of the RF amplifier, or alternatively, the failure to detect a normal operating temperature of the RF amplifier.

In an alternate embodiment of the present invention as illustrated in FIG. 4, the step of amplification of the input signals (405) involves multiple RF amplifiers. These RF amplifiers can be coupled in parallel and/or in series. Alternatively, the step of ceasing or preventing the amplification of at least one input signal (409) would include decoupling an input signal(s) from at least one of the RF amplifiers and/or removing DC supply power from at least one of the RF amplifiers.

Figure 5:
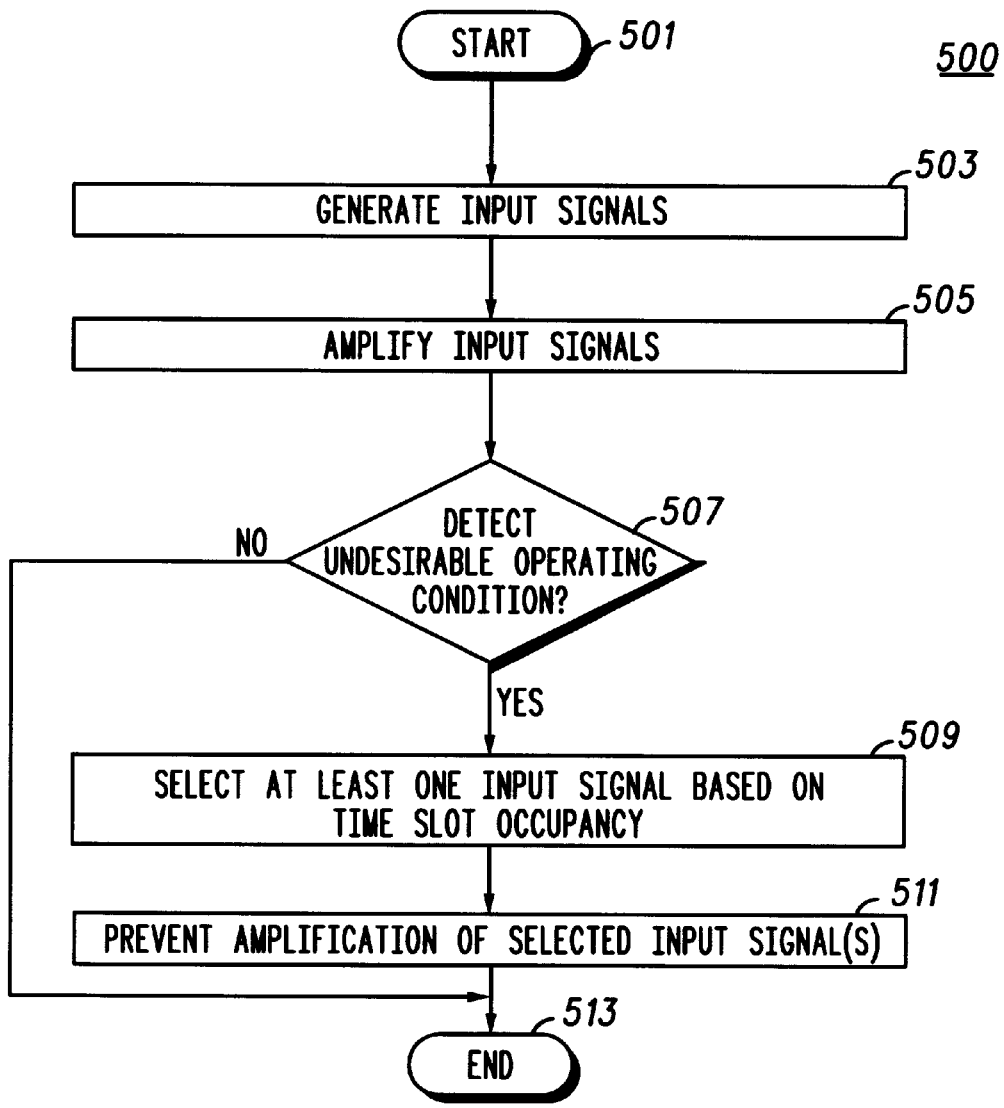
FIG. 5 is a logic flow diagram of steps executed to provide protection of a multi-channel communication device in accordance with an alternative embodiment of the present invention.

FIG. 5 illustrates a logic flow diagram 500 of steps executed by a multi-channel communication device in order to protect the communication device from operating in an undesirable operating condition in accordance with alternate embodiment of the present invention. The logic flow begins (501) with the generation of at least two input signals in the communication device (503). The input signals are routed to an amplifier section of the communication device where they are amplified by at least one RF amplifier to produce amplified signals having a desired power level (505) for subsequent transmission. A detector either detects or fails to detect an undesirable operating condition in the communication device (507), and provides an undesirable operating condition signal indicating that it has either detected or failed to detect an undesirable operating condition.

In the event that the undesirable operating condition signal indicates that the detector has detected an undesirable operating condition, at least one input signal is selected, based on time slot occupancy (509), for cessation or prevention of its amplification in order to eliminate the undesirable operating condition (511), while the power level of at least one of the amplified signals is prevented from being diminished in order to avoid reduction in geographic area coverage, and the logic flow ends (513). Preferably, the selection of a signal for cessation is based on the determination that the quantity of time slots per time frame occupied by the selected signal is greater than the number of time slots per frame occupied by another signal available for cessation. If the undesirable operating condition signal indicates that the detector has failed to detect an undesirable operating condition (507), there will be no cessation in or prevention of the amplification of the input signals.

Figure 6:
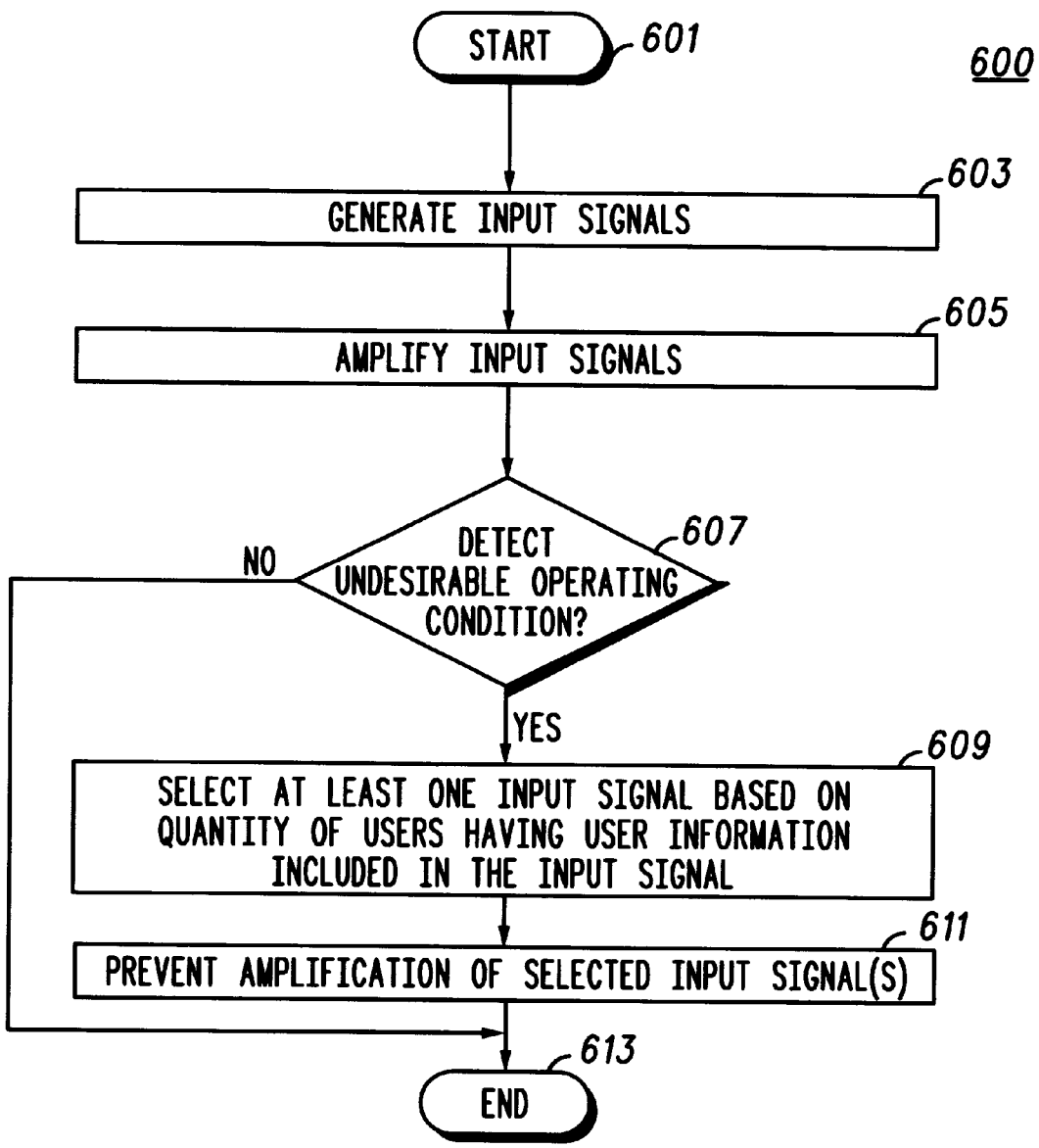
FIG. 6 is a logic flow diagram of steps executed to provide protection of a multi-channel communication device in accordance with an alternative embodiment of the present invention.

FIG. 6 illustrates a logic flow diagram 600 of steps executed by a multi-channel communication device in order to protect the communication device from operating in an undesirable operating condition in accordance with alternate embodiment of the present invention. The logic flow begins (601) with the generation of at least two input signals in the communication device (603). The input signals are routed to an amplifier section of the communication device where they are amplified by at least one RF amplifier to produce amplified signals having a desired power level (605) for subsequent transmission. A detector either detects or fails to detect an undesirable operating condition in the communication device (607), and provides an undesirable operating condition signal indicating that it has either detected or failed to detect an undesirable operating condition.

In the event that the undesirable operating condition signal indicates that the detector has detected an undesirable operating condition, at least one input signal is selected, based on a quantity of users of the communication system having user information included in the input signal (609), for cessation or prevention of its amplification in order to eliminate the undesirable operating condition (611), while the power level of at least one of the amplified signals is prevented from being diminished in order to avoid reduction in geographic area coverage, and the logic flow ends (613). Preferably, the selection of a signal for cessation is based on the determination that the selected signal is carrying user information for fewer users than another signal available for cessation. For example, in some TDMA systems, such as Motorola's "iDEN" system, a first signal may comprise three users of two time slots each in a single time frame while a second signal may comprise six users of one time slot each per frame. In such systems, it would be preferable to cease the amplification of the signal with the fewer users, i.e., the first signal, since that would result in the same amount of power reduction and less capacity reduction than would be obtained by ceasing the amplification of the second signal. If the undesirable operating condition signal indicates that the detector has failed to detect an undesirable operating condition (607), there will be no cessation in or prevention of the amplification of the input signals.

The present invention encompasses an apparatus and method for maintaining a desirable operating condition in a communications device in an undesirable environment, while not sacrificing system coverage area. With this invention, a desirable operating condition is maintained in a communications device in an undesirable environment by decoupling some, but not all, input signals prior to their reaching an RF amplifier portion of an amplifier section of the communications device. For example, an amplifier section of a base station operating in a high temperature ambient might achieve an excessively high internal temperature or DC current drain, which could threaten the continuing performance of the active devices in the amplifier section. It would then be desirable to reduce the internal temperature or current drain to maintain a desirable operating condition. The decoupling of some input signals will reduce the number of RF signals being amplified and subsequently transmitted by the base station. By amplifying fewer RF signals to a per signal power level equal to the per signal power level prior to the decoupling of some of the input signals, the amount of power being consumed by the amplifier section and dissipated within the amplifier section is reduced, as is the DC current drain, and the undesirable operating condition of the amplifier section, e.g., the excessively high internal temperature or DC current drain of the amplifier section, is eliminated. The capacity (the number of independent communications traffic channels which can be transmitted) of the mini-base site is reduced by this method. Yet the channels that continue to be amplified and transmitted will be transmitted at full power and there will be no reduction in coverage area. This tradeoff of lower capacity for constant coverage area in an undesirable environment is considered by most system providers to be superior to the opposite tradeoff of constant capacity for reduced coverage area.

While the present invention has been particularly shown and described with reference to particular embodiments thereof, it will be understood by those skilled in the art that various changes in form and details may be made therein without departing from the spirit and scope of the present invention.

We claim:

1. A communication device capable of transmitting information on at least two communication channels, the communication device comprising:

a pre-transmitter section for providing at least two input signals; and an amplifier section for amplifying the at least two input signals for transmission on the at least two communication channels, the amplifier section comprising:

at least two input ports for coupling the at least two input signals to the amplifier section;

a detector for detecting an undesirable operating condition in the communication device; and at least one decoupler, coupled to the detector, for decoupling at least one of the at least two input signals from the amplifier section in response to the detector detecting the undesirable operating condition.

2. The communication device of claim 1, wherein the amplifier section further includes at least two exciters.

3. The communication device of claim 2, wherein each exciter comprises:

a local oscillator circuit for generating a radio frequency carrier signal; and a mixer for mixing an input signal of the at least two input signals with the radio frequency carrier signal.

4. The communication device of claim 2, wherein the at least one decoupler is coupled to an exciter of the at least two exciters.

5. The communication device of claim 1, wherein the detector includes a heat sensor.

6. The communication device of claim 1, wherein the communication device further comprises a controller for determining input signal time slot occupancy.

7. The communication device of claim 6, wherein the controller comprises a microprocessor coupled to the detector and the at least one decoupler for selecting at least one of the at least two input signals to be decoupled from the amplifier section.

8. The communication device of claim 6, wherein the controller comprises a digital signal processor coupled to the detector and the at least one decoupler for selecting at least one of the at least two input signals to be decoupled from the amplifier section.

9. A method for protecting a multi-channel communication device in a time division multiple access communication system, comprising the steps of:

generating a plurality of input signals, each input signal occupying at least one time slot per time frame;

amplifying the plurality of input signals using at least one radio frequency amplifier to produce amplified signals;

detecting an undesirable operating condition in the communication device;

selecting at least one input signal of the plurality of input signals based on a quantity of time slots occupied in a time frame to produce at least one selected input signal; and preventing the at least one selected input signal from being amplified in order to remove the undesirable operating condition.

10. The method of claim 9, wherein the step of detecting an undesirable operating condition in the communication device includes detecting an excessively high operating temperature of the at least one radio frequency amplifier.

11. The method of claim 9, wherein the step of detecting an undesirable operating condition in the communication device includes the failure to detect a normal operating temperature of the at least one radio frequency amplifier.

12. The method of claim 9, wherein the step of amplifying comprises the step of amplifying the plurality of input signals using at least two radio frequency amplifiers.

13. The method of claim 12, wherein the step of preventing comprises the step of decoupling at least one input signal of the plurality of input signals from at least one of the at least two radio frequency amplifiers.

14. The method of claim 12, wherein the step of preventing comprises the step of removing DC supply power from at least one of the at least two radio frequency amplifiers.

15. A method for protecting a multi-channel communication device, the method comprising the steps of:

generating at least two input signals;

amplifying, by an amplifier section, the at least two input signals to produce amplified signals;

detecting an undesirable operating condition in the communication device; and preventing at least one of the at least two input signals from being amplified in order to remove the undesirable operating condition.

16. The method of claim 15, wherein the step of detecting an undesirable operating condition comprises the step of detecting an excessively high operating temperature of at least one radio frequency amplifier.

17. The method of claim 15, wherein the step of detecting an undesirable operating condition in the communication device comprises the step of failing to detect a normal operating temperature of at least one radio frequency amplifier.

18. A method for protecting a communication device, comprising the steps of:

generating a plurality of input signals, each input signal including user information of at least one user of a communication system containing the communication device;

amplifying the plurality of input signals;

detecting an undesirable operating condition in the communication device;

selecting at least one input signal of the plurality of input signals based on a quantity of users of the communication system having user information included in the at least one input signal to produce at least one selected input signal; and preventing the at least one selected input signal from being amplified in order to remove the undesirable operating condition.

19. The method of claim 18, wherein the step of selecting comprises the step of selecting a first input signal of the plurality of input signals as the at least one selected input signal, wherein the first input signal includes user information of fewer users than at least a second input signal of the plurality of input signals.

* * * * *